(12) United States Patent
Haraguchi

(10) Patent No.: US 12,027,500 B2
(45) Date of Patent: Jul. 2, 2024

(54) CIRCUIT STRUCTURE AND ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 792 days.

(21) Appl. No.: 17/271,068

(22) PCT Filed: Aug. 16, 2019

(86) PCT No.: PCT/JP2019/032097
§ 371 (c)(1),
(2) Date: Feb. 24, 2021

(87) PCT Pub. No.: WO2020/049976
PCT Pub. Date: Mar. 12, 2020

(65) Prior Publication Data
US 2021/0327776 A1    Oct. 21, 2021

(30) Foreign Application Priority Data

Sep. 3, 2018  (JP) .................................. 2018-164663

(51) Int. Cl.
*H01L 25/07* (2006.01)
*H01L 23/04* (2006.01)
(Continued)

(52) U.S. Cl.
CPC .......... *H01L 25/072* (2013.01); *H01L 23/041* (2013.01); *H01L 23/36* (2013.01);
(Continued)

(58) Field of Classification Search
CPC ................ H01R 9/2466; H01R 25/162; H01R 2201/26; H01L 25/072; H01L 23/041;
(Continued)

(56) References Cited

U.S. PATENT DOCUMENTS 8,531,840 B2 *  9/2013  Tachibana ............. H02M 7/003
                                              361/689
8,823,053 B2 *  9/2014  Sakiyama ............. H01L 25/072
                                              336/200

(Continued)

FOREIGN PATENT DOCUMENTS

JP      2015-138881 A      7/2015

OTHER PUBLICATIONS

International Search Report, Application No. PCT/JP2019/032097, mailed Nov. 12, 2019. ISA/Japan Patent Office.

*Primary Examiner* — Jean F Duverne
(74) *Attorney, Agent, or Firm* — Honigman LLP

(57) ABSTRACT

A circuit structure includes a plurality of semiconductor elements arranged side by side, and each semiconductor element includes source terminals and at least one gate terminal arranged side by side with the source terminals. The circuit structure includes: a first bus bar connected to the source terminals of the semiconductor elements; connection portions that connect the source terminals and the first bus bar and are arranged side by side along the arrangement direction of the semiconductor elements and whose one ends are connected to the source terminals of the respective semiconductor elements; an insulating portion provided so as to be present between each adjacent pairs of the connec-
(Continued)

tion portions; and conductive portions provided in the insulating portion and connected to the gate terminals.

15 Claims, 11 Drawing Sheets

(51) Int. Cl.
*H01L 23/36* (2006.01)
*H01L 23/492* (2006.01)
*H01L 23/498* (2006.01)
*H01L 23/538* (2006.01)
*H01R 9/24* (2006.01)
*H01R 25/16* (2006.01)
*H02G 3/16* (2006.01)
*H05K 1/11* (2006.01)
*H05K 3/34* (2006.01)
*H05K 7/14* (2006.01)

(52) U.S. Cl.
CPC ......... *H01L 23/492* (2013.01); *H01R 9/2466* (2013.01); *H01R 25/162* (2013.01); *H02G 3/16* (2013.01); *H05K 1/115* (2013.01); *H05K 7/1432* (2013.01); *H05K 7/14322* (2022.08); *H01L 23/49838* (2013.01); *H01L 23/49861* (2013.01); *H01L 23/5386* (2013.01); *H01R 2201/26* (2013.01); *H05K 3/3447* (2013.01); *H05K 2201/09236* (2013.01); *H05K 2201/10166* (2013.01); *H05K 2201/10272* (2013.01); *H05K 2201/10303* (2013.01)

(58) Field of Classification Search
CPC . H01L 23/36; H01L 23/492; H01L 23/49838; H01L 23/49861; H01L 23/5386; H02G 3/16; H05K 1/115; H05K 7/1432; H05K 3/3447; H05K 2201/10303; H05K 2201/09236; H05K 2201/10166
See application file for complete search history.

(56) References Cited

U.S. PATENT DOCUMENTS

| | | | |
|---|---|---|---|
| 2015/0093067 A1* | 4/2015 | Manouvrier | G02F 1/025 385/3 |
| 2015/0146340 A1* | 5/2015 | Yun | H01G 4/30 427/79 |
| 2018/0370463 A1 | 12/2018 | Haraguchi et al. | |
| 2019/0045635 A1 | 2/2019 | Chin et al. | |

* cited by examiner

CIRCUIT STRUCTURE AND ELECTRICAL JUNCTION BOX

CROSS-REFERENCE TO RELATED APPLICATIONS

This application is the U.S. national stage of PCT/JP2019/032097 filed on Aug. 16, 2019, which claims priority of Japanese Patent Application No. JP 2018-164663 filed on Sep. 3, 2018, the contents of which are incorporated herein.

TECHNICAL FIELD

The present disclosure relates to a circuit structure with semiconductor elements mounted thereon and an electrical junction box including the circuit structure.

BACKGROUND

Conventionally, automobiles are equipped with an electrical junction box for distributing electric power from a power source to loads such as headlamps and windshield wipers. The electrical junction box includes a bus bar to be connected to the power source to constitute a power circuit, and a circuit board provided with a control circuit for controlling the power circuit. The power circuit is provided with, for example, a switching element for switching between supply and shut off of electric power.

JP 2015-138881A proposes an injection-molded substrate obtained by coating a bent circuit conductor with an injected resin. This injection-molded substrate is configured such that portions of the circuit conductor are exposed from the injected resin and the exposed portions are flush with the injected resin. This configuration enables screen printing on the injection-molded substrate.

When a semiconductor switching element such as a metal oxide semiconductor field effect transistor (MOSFET) is used, a drain terminal, a source terminal, and a gate terminal need to be connected to separate bus bars.

In general, the terminal arrangement in a switching element is such that a source terminal and a gate terminal are arranged side by side in a line, and bus bars are arranged with a predetermined gap that is determined according to the terminal pitch interposed therebetween. Further, a bus bar used for a drain terminal is also arranged spaced apart from the bus bars used for the source terminal and the gate terminal by a predetermined gap.

However, in recent years, miniaturization of switching elements has led to a reduction in terminal pitches, which makes it physically difficult to arrange bus bars next to each other. When a plurality of switching elements are arranged side by side, the arrangement of bus bars becomes even more difficult.

However, the electronic component mounting substrate according to JP 2015-138881A is not configured to address such a problem and thus cannot solve the problem.

In light of the foregoing, it is an object of the present disclosure to provide a circuit structure and an electrical junction box that enable accurate wiring when a plurality of semiconductor elements having a narrow terminal pitch are arranged side by side.

SUMMARY

A circuit structure according to one aspect of the present disclosure is a circuit structure including a plurality of semiconductor elements that are arranged side by side, each semiconductor element including a plurality of first terminals and at least one second terminal that is arranged side by side with the first terminals, the circuit structure including: a first conductive piece connected to the first terminals of the semiconductor elements; a plurality of connection portions that connect the first terminals and the first conductive piece, the connection portions being arranged side by side along an arrangement direction of the semiconductor elements and one end of each connection portion being connected to the first terminals of a corresponding one of the semiconductor elements; an insulating portion that is provided so as to be present between each adjacent pair of connection portions; and conductive portions that are provided in the insulating portion and are connected to the second terminals.

An electrical junction box according to another aspect of the present disclosure is an electrical junction box including: the above-described circuit structure; and a control circuit board for controlling the semiconductor elements of the circuit structure.

First, embodiments of the present disclosure will be enumerated and described below. Any two or more of the following embodiments may be combined with each other.

A circuit structure according to one embodiment of the present disclosure is a circuit structure including a plurality of semiconductor elements that are arranged side by side, each semiconductor element including a plurality of first terminals and at least one second terminal that is arranged side by side with the first terminals, the circuit structure including: a first conductive piece connected to the first terminals of the semiconductor elements; a plurality of connection portions that connect the first terminals and the first conductive piece, the connection portions being arranged side by side along an arrangement direction of the semiconductor elements and one end of each connection portion being connected to the first terminals of a corresponding one of the semiconductor elements; an insulating portion that is provided so as to be present between each adjacent pair of connection portions; and conductive portions that are provided in the insulating portion and are connected to the second terminals.

In the present embodiment, the first terminals are connected to the connection portions, and the second terminals are connected to the conductive portions provided in the insulating portion that is provided so as to be present between each adjacent pair of connection portions. Accordingly, even when the semiconductor elements each having the first terminals and the second terminal(s) arranged at a small pitch are arranged side by side, wiring can be performed with high accuracy, and accordingly, it is possible to prevent the occurrence of short-circuiting or the like between the wiring for the first terminals and the wiring for the second terminal(s).

In the circuit structure according to a further embodiment of the present disclosure, each connection portion has a bent rectangular plate-like shape, and the insulating portion includes a comb-toothed portion that engages with the one ends of the respective connection portions.

In the present embodiment, since the comb-toothed portion of the insulating portion engages with the one ends of the respective connection portions, the insulating portion is present between each adjacent pair of connection portions. Accordingly, even when the semiconductor elements each having the first terminals and the second terminal(s) arranged at a small pitch are arranged side by side, wiring can be performed with high accuracy, and thus, it is possible to prevent the occurrence of short-circuiting or the like between the wiring for the first terminals and the wiring for the second terminal(s).

In the circuit structure according to a still further embodiment of the present disclosure, the first conductive piece and the plurality of connection portions are integrally formed.

In the present embodiment, the first conductive piece and the connection portions are integrally formed. Accordingly, no connection point is present between the first conductive piece and the connection portions, and thus electric resistance between the first conductive piece and the connection portions can be reduced.

In the circuit structure according to a still further embodiment of the present disclosure, an end surface of each connection portion on the side of the one ends connected to the first terminals is flush with a conductive surface of the insulating portion on which the conductive portions are formed.

In the present embodiment, the conductive surface of the insulating portion on which the conductive portions are formed is flush with the end surface of each connection portion on the side of the one ends connected to the first terminals. Accordingly, in one semiconductor element, wiring of the first terminals and the second terminal(s), which are arranged side by side, can be easily performed.

The circuit structure according to a still further embodiment of the present disclosure includes a second conductive piece that is provided flush with the conductive surface of the insulating portion and is spaced apart from the connection portions in a direction transverse to an arrangement direction of the connection portions with a first gap interposed between the second conductive piece and the connection portions, and a third terminal of each semiconductor element is connected to the second conductive piece.

In the present embodiment, the second conductive piece is spaced apart from the connection portions with the first gap interposed therebetween, whereby the third terminals are insulated from the first terminals and the second terminals. Further, since the second conductive piece is flush with the conductive surface of the insulating portion, wiring for the first terminals, the second terminal(s), and the third terminal provided in one semiconductor element can be provided on the same plane.

In the circuit structure according to a still further embodiment of the present disclosure, the insulating portion is rectangular, the comb-toothed portion is formed in a region excluding both ends of one edge portion of the insulating portion, and gap maintaining portions that maintain the first gap between the first conductive piece and the second conductive piece are provided on both end sides of the one edge portion.

In the present embodiment, the gap maintaining portions that maintain the first gap between the first conductive piece and the second conductive piece are provided on both end sides of the one edge portion where the comb-toothed portion is not formed, i.e., in regions of the one edge portion where the semiconductor elements are not provided. Accordingly, problems caused by thermal expansion of the gap maintaining portions due to heat generated by the semiconductor elements can be prevented in advance.

In the circuit structure according to a still further embodiment of the present disclosure, in a direction transverse to an arrangement direction of the connection portions, a second gap is formed between each connection portion and the comb-toothed portion of the insulating portion.

In the present embodiment, between each connection portion and the comb-toothed portion of the insulating portion, the second gap is formed in the direction transverse to the arrangement direction of the connection portions. Accordingly, for example, when the semiconductor elements generate heat, deformation of the connection portions in the direction transverse to the arrangement direction of the connection portions is allowed, and thus stress can be reduced.

The electrical junction box according to an embodiment of the present disclosure includes any one of the above-described circuit structures and a control circuit board for controlling the semiconductor elements of the circuit structure.

According to the present embodiment, the control circuit board controls the semiconductor elements of the circuit structure to make the circuit structure operate as appropriate.

Advantageous Effects of Disclosure

In one aspect, the present disclosure can provide a circuit structure and an electrical junction box that enable accurate wiring when a plurality of semiconductor elements having a narrow terminal pitch are arranged side by side.

DETAILED DESCRIPTION OF PREFERRED EMBODIMENTS

The present disclosure will be described specifically based on drawings illustrating the embodiments of the present disclosure. A circuit structure and an electrical junction box according to an embodiment of the present disclosure will be described below with reference to the drawings. It should be noted that the present disclosure is not limited to the embodiments disclosed herein for illustrative purposes only. The scope of the present disclosure should be defined by the appended claims, and all modifications equivalent to or within the spirit and scope of the appended claims are therefore intended to be encompassed by the present disclosure.

The following description is directed to an example where the circuit structure and the electrical junction box according to the present embodiment are applied to an electrical junction box for distributing electric power from a power source to loads such as headlamps and windshield wipers.

Figure 1:
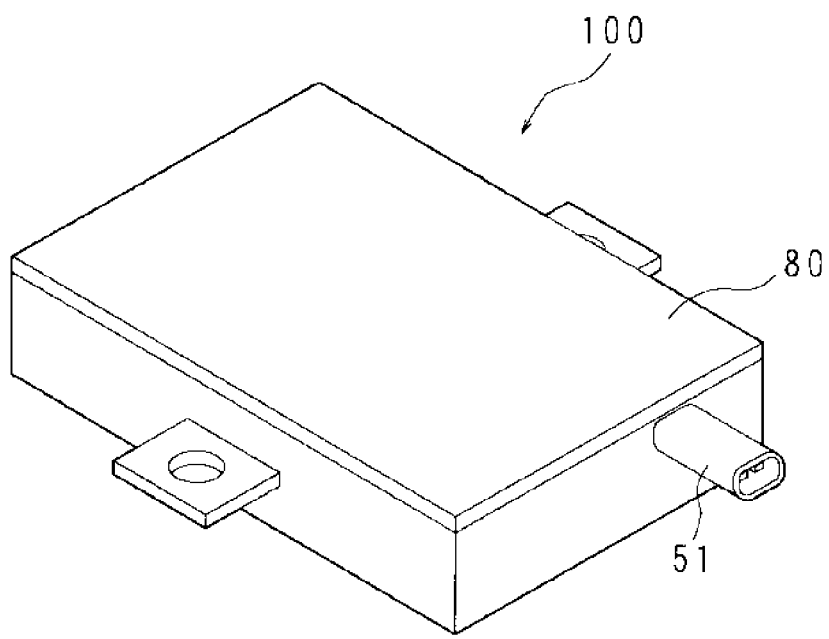
FIG. 1 is a perspective view showing the appearance of an electrical junction box according to the present embodiment.
Figure 2:
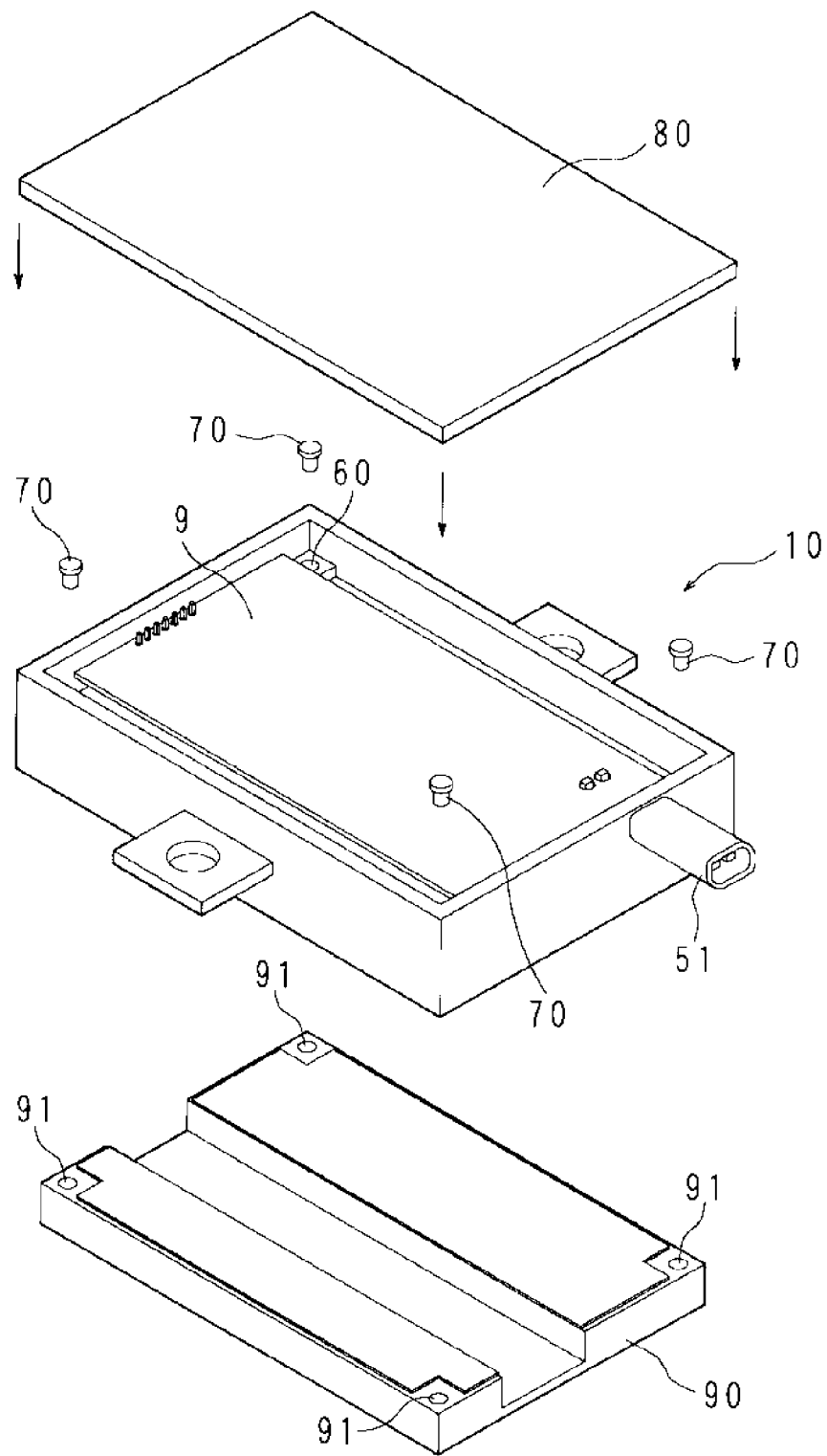
FIG. 2 is an exploded view of the electrical junction box according to the present embodiment.

FIG. 1 is a perspective view showing the appearance of an electrical junction box 100 according to the present embodiment, and FIG. 2 is an exploded view of the electrical junction box 100 according to the present embodiment.

The electrical junction box 100 according to the present embodiment is approximately box shaped, and includes a control circuit board 9, a circuit structure 10 that houses the control circuit board 9, a lid 80 that covers the circuit structure 10, and a heat sink 90 that is configured to dissipate heat generated by the circuit structure 10 and is provided on the opposite side of the lid 80 with the circuit structure 10 interposed therebetween. The heat sink 90 is attached to the circuit structure 10 by inserting screws 70 into through-holes 60 formed at four corners of the circuit structure 10 and then screwing the screws 70 into screw holes 91 formed at four corners of the heat sink 90.

Figure 3:
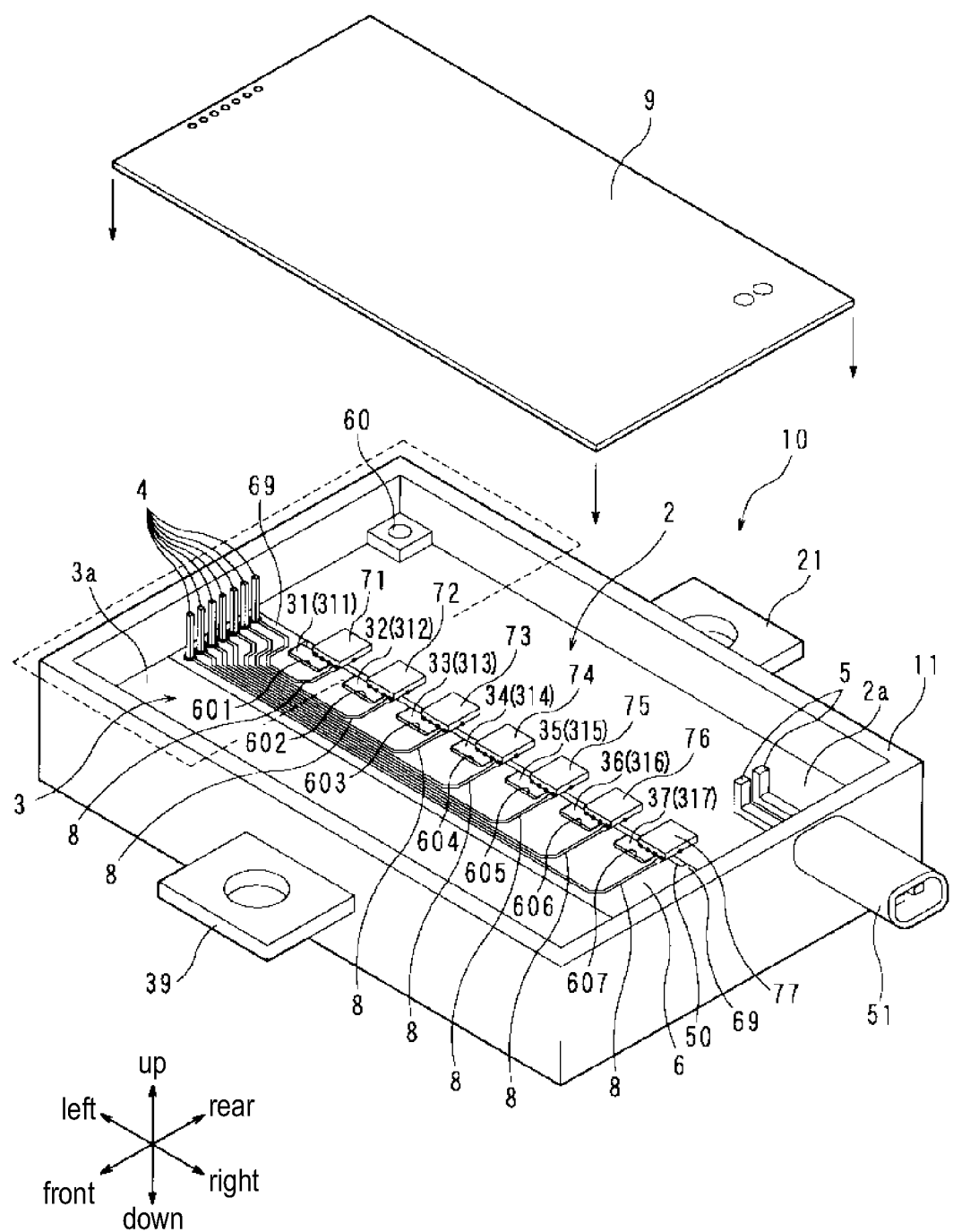
FIG. 3 is an exploded view of a circuit structure according to the present embodiment.

In the circuit structure 10, a plurality of semiconductor elements 71 to 77 are arranged side by side (see FIG. 3). For convenience of description, the semiconductor elements 71 to 77 are hereinafter also referred to simply as "semiconductor elements 7". The semiconductor elements 71 to 77 all have the same configuration. Accordingly, for convenience of description, the semiconductor element 71 will be described by way of example, and the descriptions of the semiconductor elements 72 to 77 will be omitted.

Figure 4:
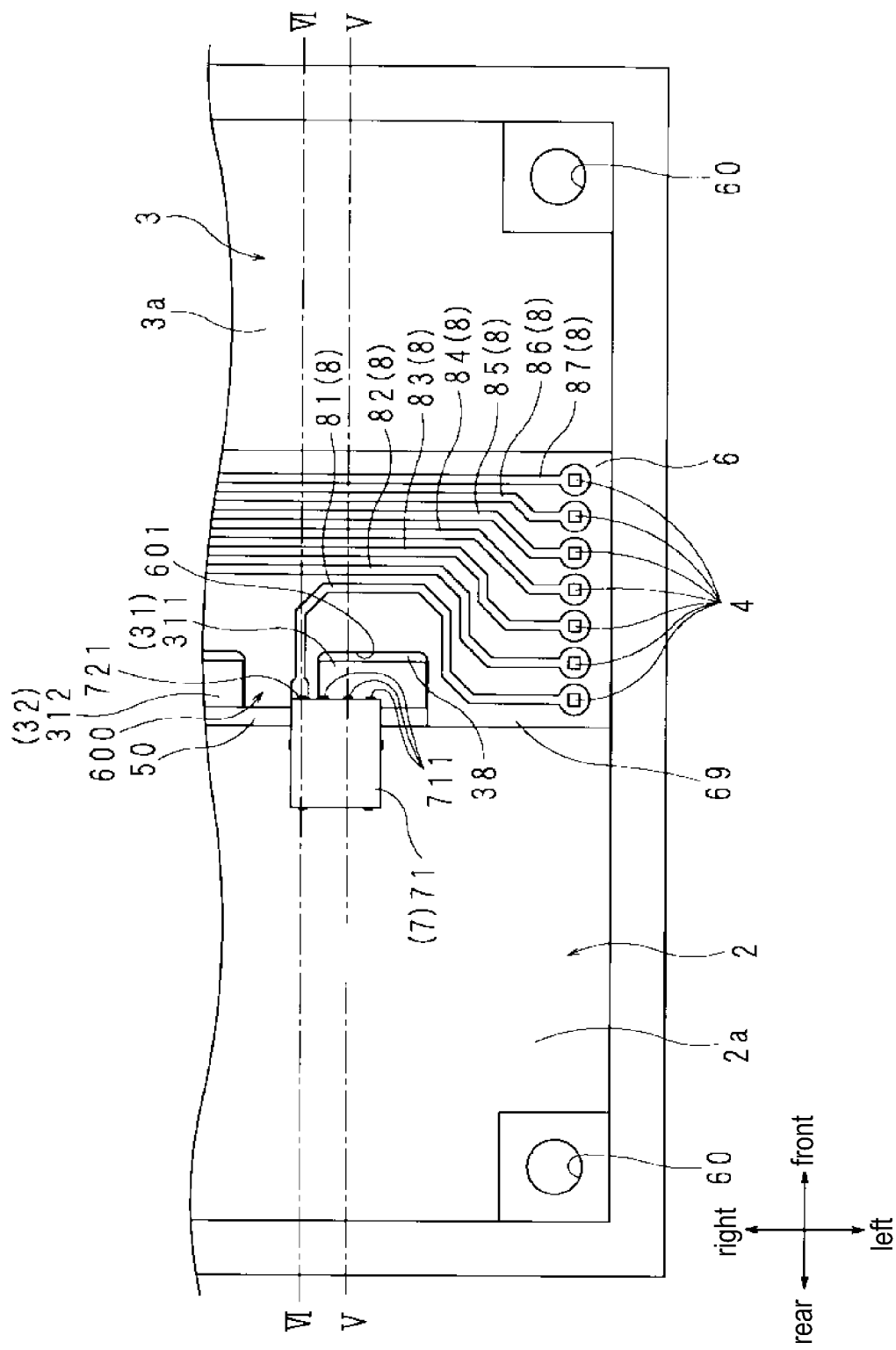
FIG. 4 is an enlarged view of a rectangular region indicated with a dashed line in FIG. 3.

FIG. 3 is an exploded view of the circuit structure 10 according to the present embodiment, and FIG. 4 is an enlarged view of a rectangular region indicated with a broken line in FIG. 3.

Figure 5:
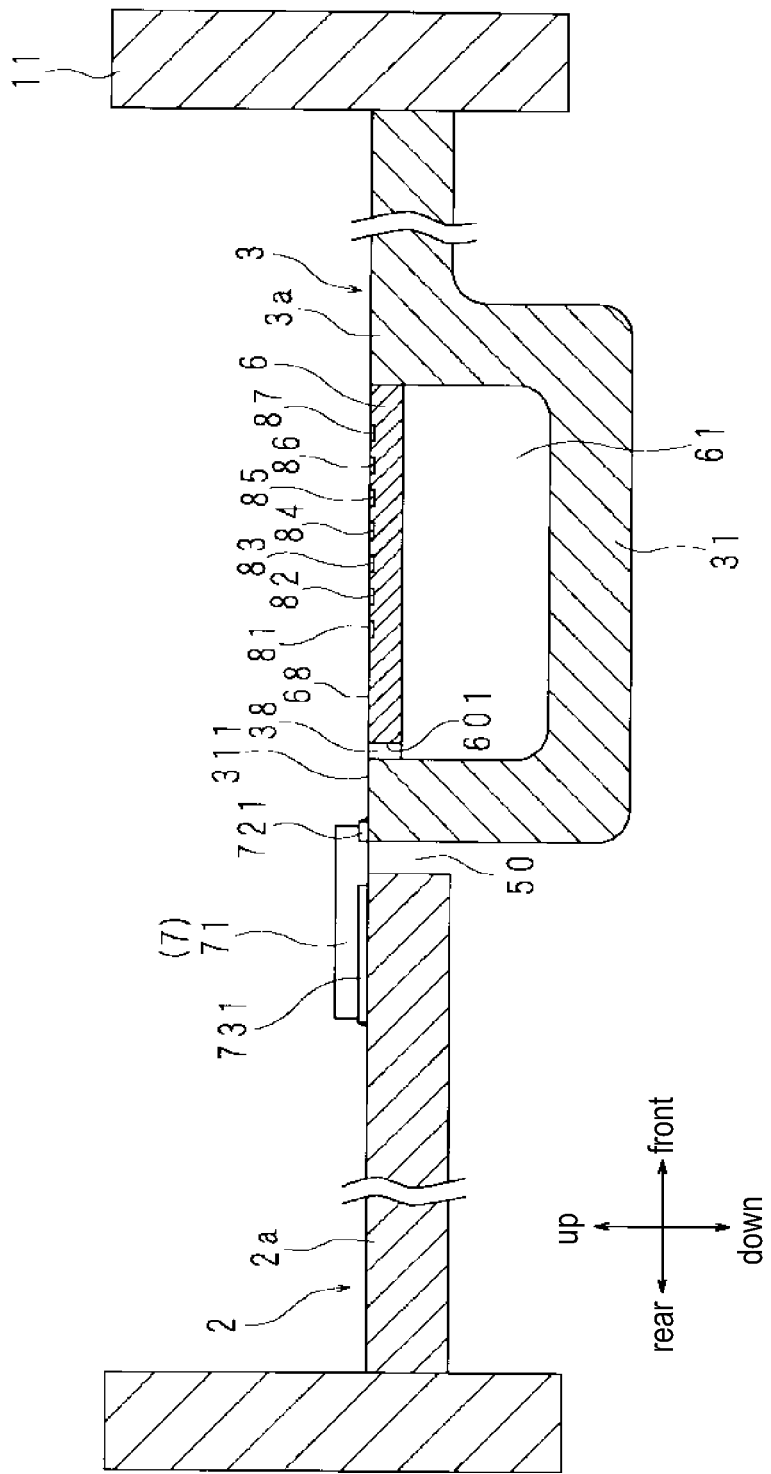
FIG. 5 is a vertical cross-sectional view taken along line V-V in FIG. 4.
Figure 6:
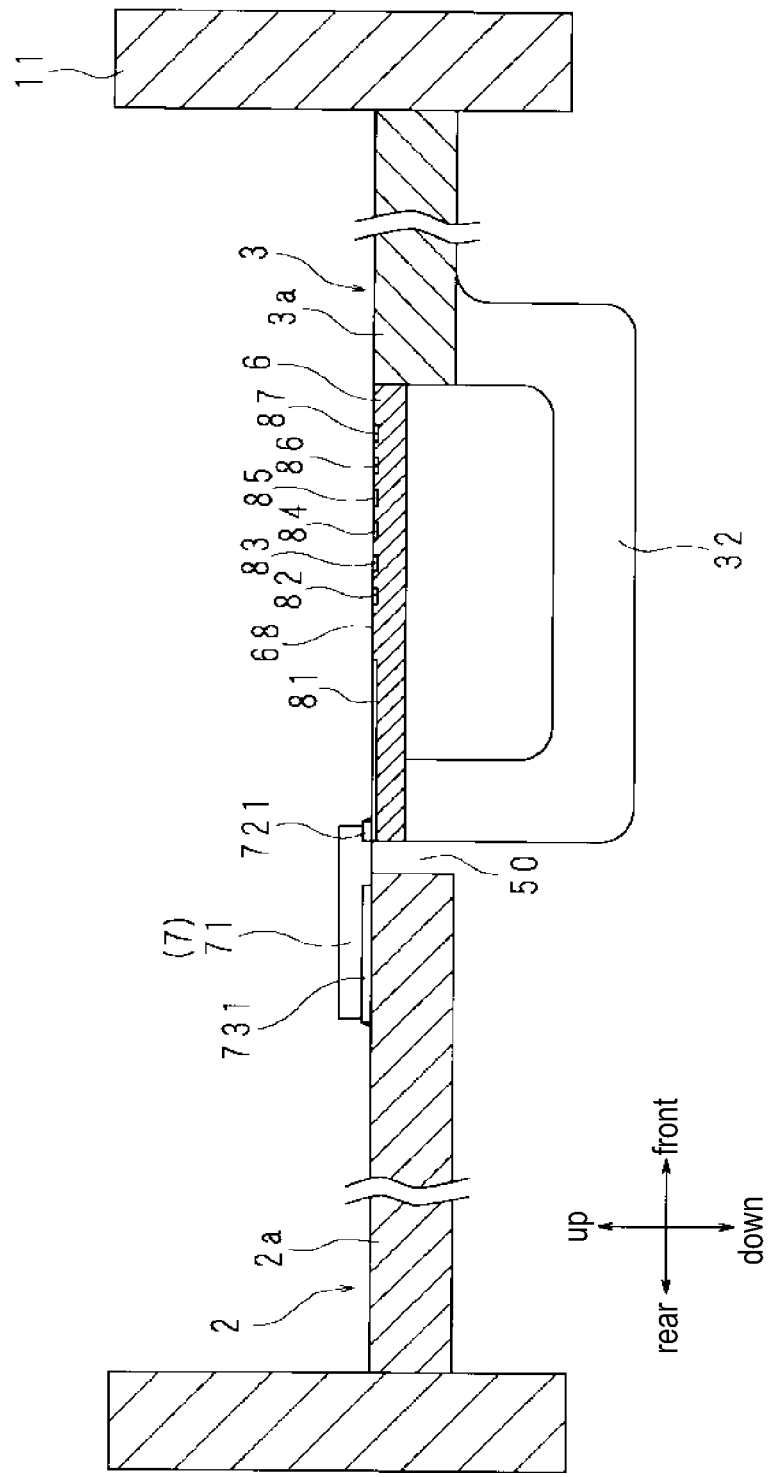
FIG. 6 is a vertical cross-sectional view taken along line VI-VI in FIG. 4.
Figure 7:
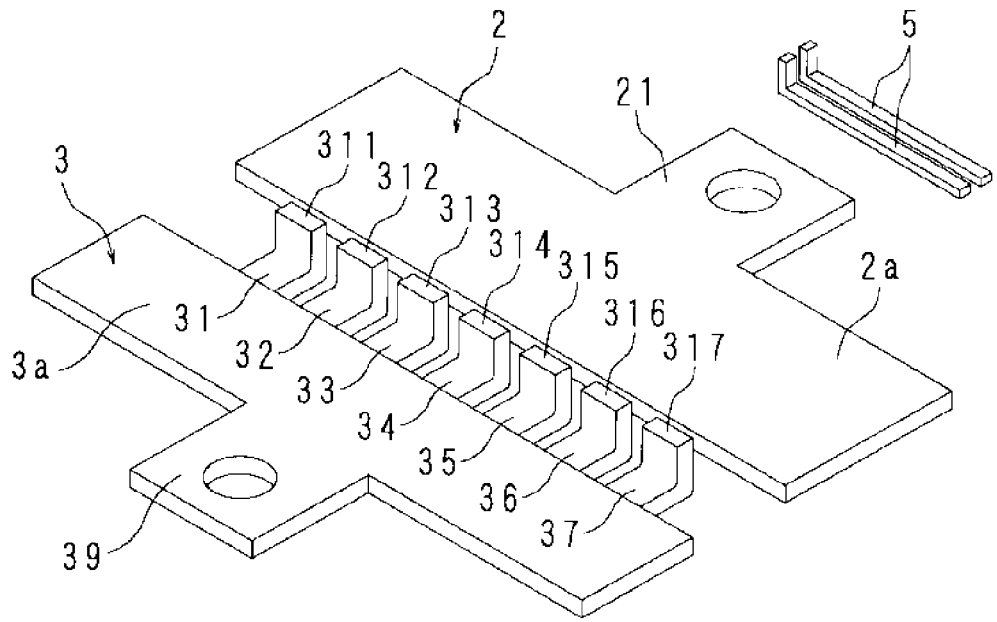
FIG. 7 is a diagram for illustrating a production method of the circuit structure according to the present embodiment.

Each semiconductor element 7 is, for example, an FET (more specifically, a surface-mount type power MOSFET), and includes three source terminals 711 (first terminals), a gate terminal 721 (second terminal), and a drain terminal 731 (see FIGS. 5 and 6). The three source terminals 711 and the gate terminal 721 are arranged side by side in a line, and the drain terminal 731 (third terminal) is provided under the semiconductor element 7.

The semiconductor elements 71 to 77 are mounted so as to span a first conductor 3 that includes a first bus bar 3a (first conductive piece) (the first conductor 3 is an integrally-formed member) and a second conductor 2 that includes a second bus bar 2a (second conductive piece). That is, the first conductor 3 and the second conductor 2 are arranged with a predetermined gap 50 (first gap) interposed therebetween in a direction (front-rear direction) transverse to the arrangement direction of the semiconductor elements 71 to 77, one end of each semiconductor element 7 is connected to the first conductor 3, and the other end of the same opposing the one end is connected to the second conductor 2. The semiconductor elements 71 to 77 are fixed to the second conductor 2.

The first conductor 3 and the second conductor 2 are arranged such that, for example, their substantially rectangular upper surfaces are flush with each other. In this state, the first conductor 3 and the second conductor 2 are housed in a frame body 11. The first bus bar 3a included in the first conductor 3 and the second bus bar 2a included in the second conductor 2 are arranged such that their longitudinal directions coincide with the longitudinal direction of the frame body 11. The frame body 11 supports the first conductor 3 and the second conductor 2 by surrounding their side surfaces.

The frame body 11 has a hollow rectangular shape and has a predetermined thickness in the up-down direction. Connector terminals 5 connected to the control circuit board 9 are provided passing through a right side wall of the frame body 11 in the thickness direction of the side wall. One end of each connector terminal 5 protrudes to the inside of the frame body 11, and the other end of the same protrudes to the outside of the frame body 11. A cylindrical housing 51 for protecting the other ends of the connector terminals 5 is attached to the outside of the right side wall of the frame body 11.

The first conductor 3 includes the first bus bar 3a, an insulating portion 6, and connection portions 31 to 37 (connection portions). The first conductor 3 is provided with a terminal plate 39 that extends perpendicularly from a side surface of the first bus bar 3a on the front side (long-edge side) (see FIG. 8). The terminal plate 39 is to be connected to a power source (battery) or a load (such as a headlamp or a windshield wiper). The terminal plate 39 passes through the side wall of the frame body 11 on the front side and protrudes to the outside of the frame body 11.

Figure 8:
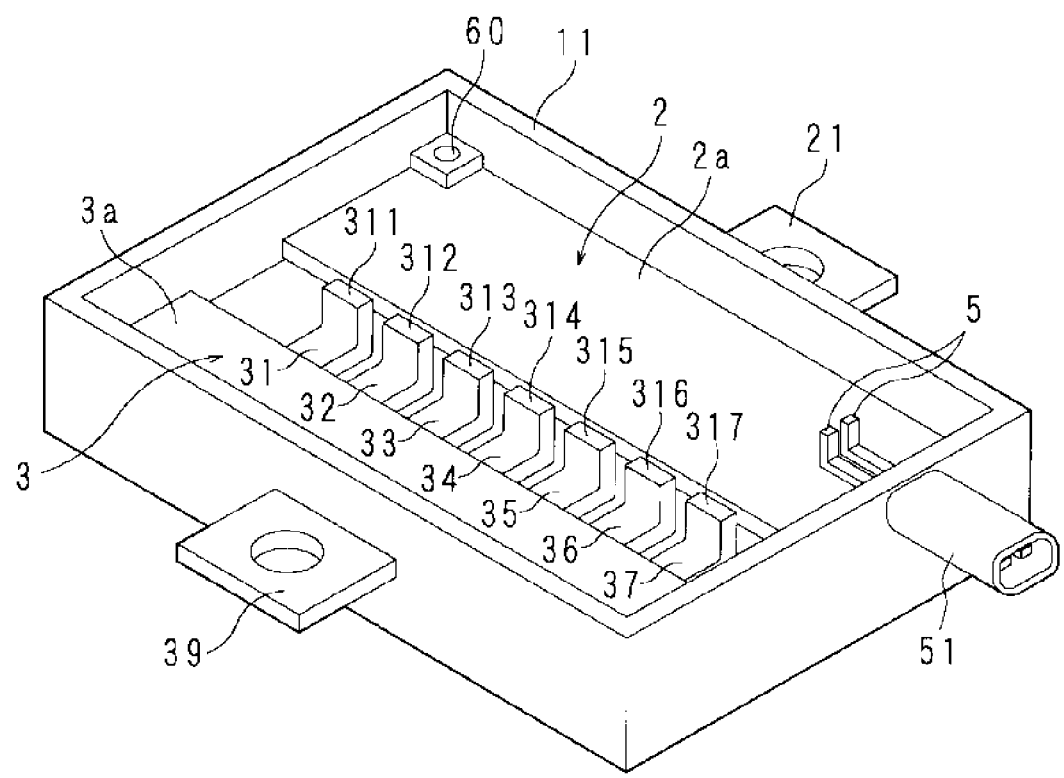
FIG. 8 is another diagram for illustrating the production method of the circuit structure according to the present embodiment.

The second conductor 2 is provided with a terminal plate 21 that extends perpendicularly from a side surface of the second bus bar 2a on the rear side (long-edge side) (see FIG. 8). The terminal plate 21 is to be connected to a power source (battery) or a load (such as a headlamp or a windshield wiper). The terminal plate 21 passes through the side wall of the frame body 11 on the rear side and protrudes to the outside of the frame body 11.

FIG. 5 is a vertical cross-sectional view taken along line V-V in FIG. 4, and FIG. 6 is a vertical cross-sectional view taken along line VI-VI in FIG. 4. In the front-rear direction, a rear end portion of the first conductor 3 and a front end portion of the second conductor 2 face each other with the gap 50 interposed therebetween. Accordingly, the first conductor 3 and the second conductor 2 are insulated from each other.

The insulating portion 6 is provided in the rear half of an upper surface of the first conductor 3 in the front-rear direction. The insulating portion 6 is made of a highly heat-resistant thermoplastic resin such as polyp henylene sulfide (PPS). The first bus bar 3a is provided in the front half of the first conductor 3 in the front-rear direction. The first bus bar 3a is made of, for example, pure copper or a copper alloy, and the upper surface of the first bus bar 3a is plated with nickel.

The insulating portion 6 has an approximately rectangular plate-like shape, and is an insulating substrate, for example. A peripheral edge (one edge portion) of the insulating portion 6 on the rear side is provided with the connection portions 31 to 37 connected to the source terminals of the semiconductor elements 71 to 77. Each of the connection portions 31 to 37 is connected to the three source terminals of a corresponding one of the semiconductor elements 7. For example, the connection portion 31 is connected to the three source terminals 711 of the semiconductor element 71 (see FIG. 4).

Figure 9:
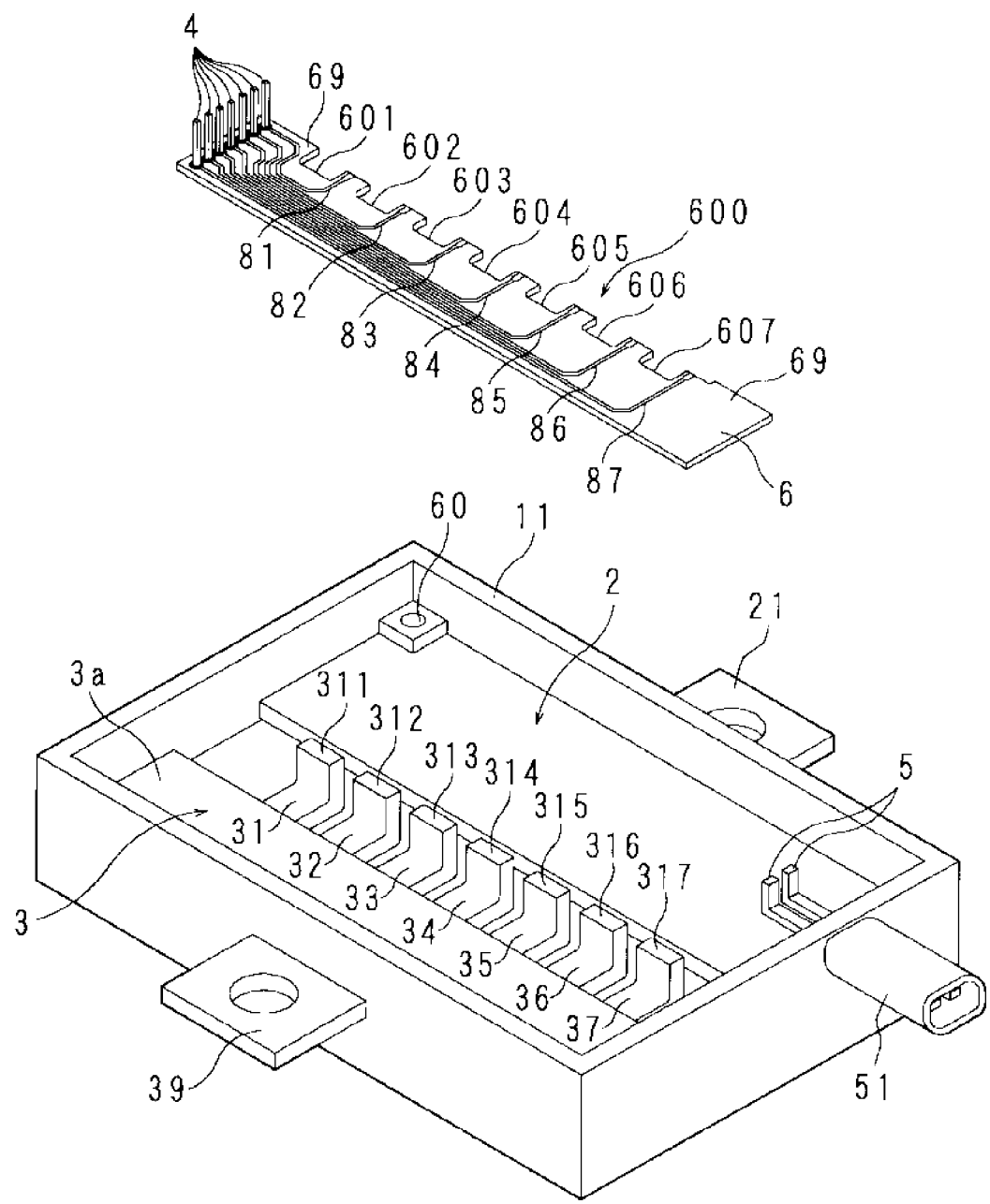
FIG. 9 is still another diagram for illustrating the production method of the circuit structure according to the present embodiment.
Figure 10:
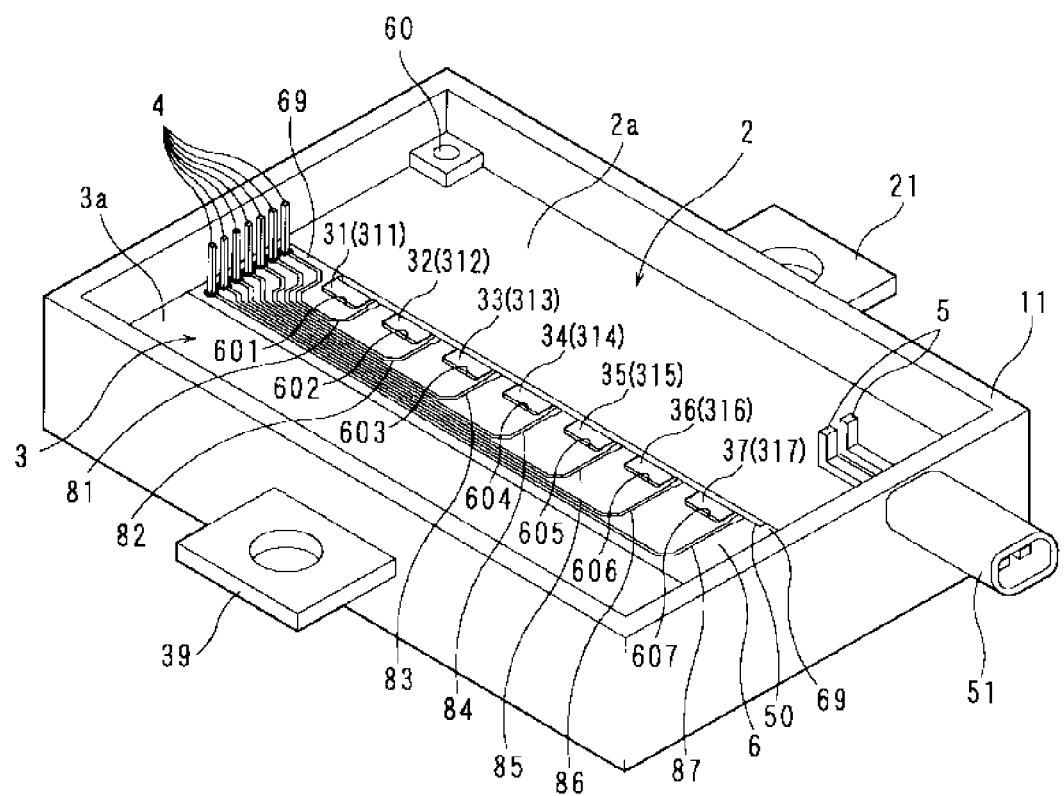
FIG. 10 is still another diagram for illustrating the production method of the circuit structure according to the present embodiment.
Figure 11:
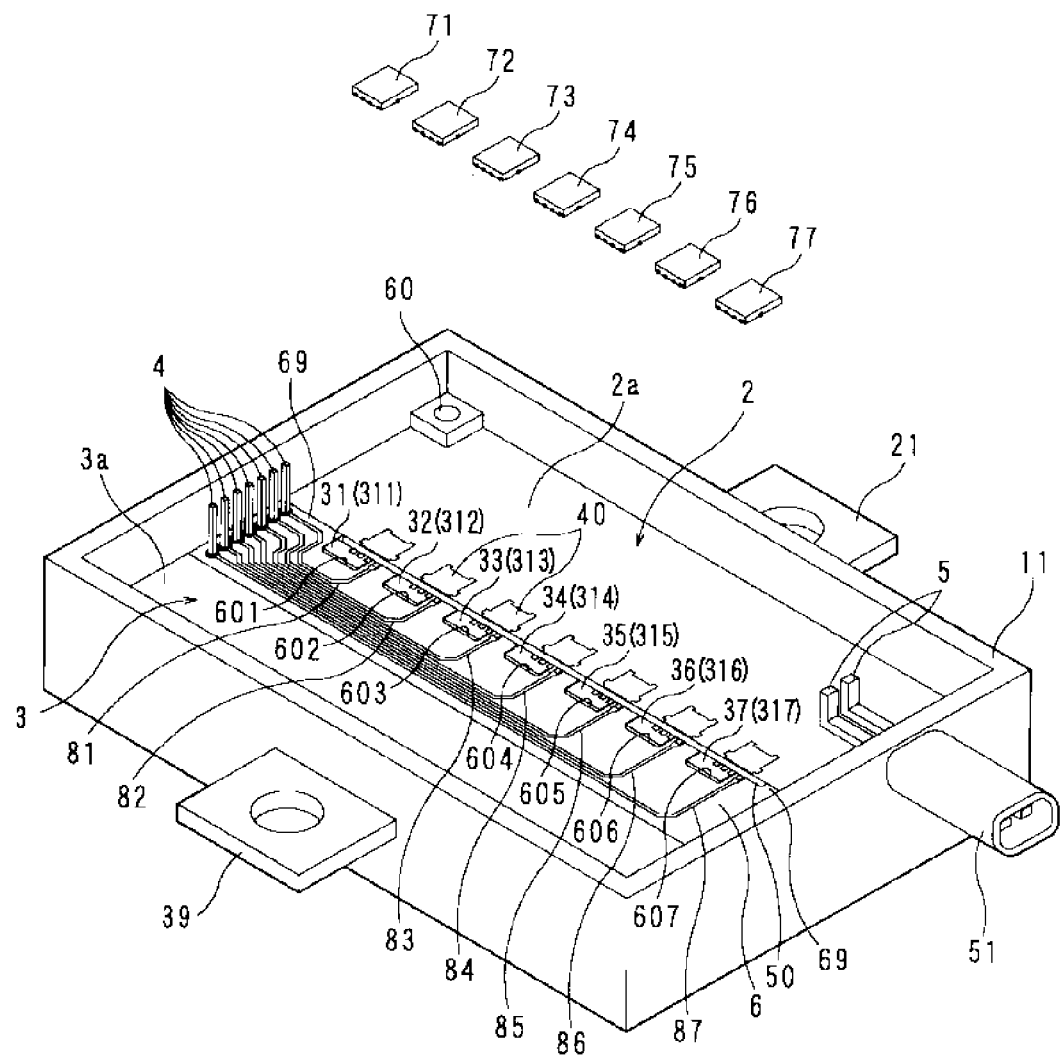
FIG. 11 is still another diagram for illustrating the production method of the circuit structure according to the present embodiment.
Figure 12:
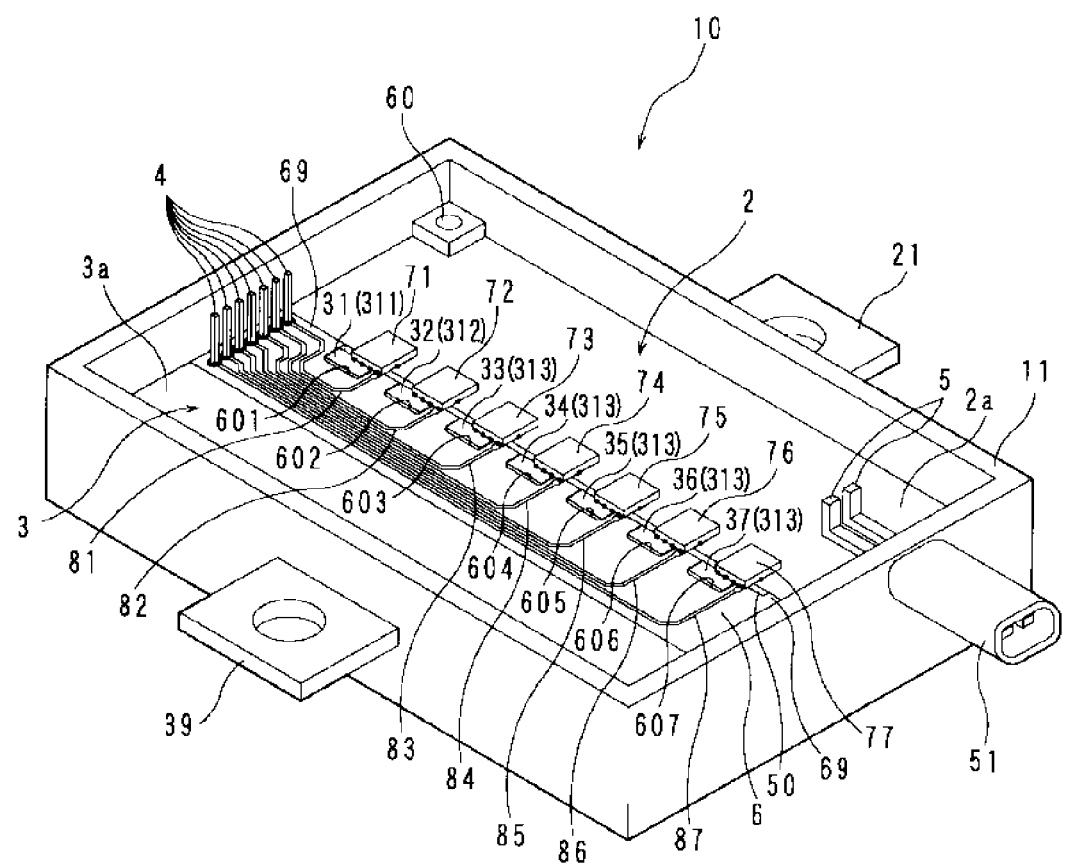
FIG. 12 is still another diagram for illustrating the production method of the circuit structure according to the present embodiment.

More specifically, the insulating portion 6 includes a comb-toothed portion 600 formed in a region excluding both end portions of the above-described rear peripheral edge (see FIG. 9). In the comb-toothed portion 600, empty portions 601 to 607 are provided at positions that are in the region excluding both end portions of the rear peripheral edge of the insulating portion 6 and that correspond to the positions of the connection portion 31 to 37. The empty portions 601 to 607 have rectangular shapes conforming to the shapes of one end portions of the connection portions 31 to 37.

The one end portions of the connection portions 31 to 37 engage with the comb-toothed portion 600. More specifically, the one end portions of the connection portions 31 to 37 are positioned in the empty portions 601 to 607, respectively. With this configuration, the insulating portion 6 is present between adjacent pairs of the connection portions 31 to 37, whereby the connection portions 31 to 37 are insulated from each other.

The connection portions 31 to 37 each have, for example, a rectangular plate-like shape that is bent to form a C-shape with a space 61 formed on the inner side thereof. The connection portions 31 to 37 are arranged side by side at regular intervals along the arrangement direction of the semiconductor elements 71 to 77, i.e., in the left-right direction. One ends of the connection portions 31 to 37 are connected to the source terminals of the semiconductor elements 71 to 77, respectively, and the other ends of the same are connected to the first bus bar 3a.

End surfaces 311 to 317 on the one end side of the connection portions 31 to 37 are rectangular, and the source terminals of the semiconductor elements 71 to 77 are connected to these end surfaces 311 to 317. For example, the three source terminals 711 of the semiconductor element 71 are connected to the end surface 311 of the connection portion 31.

Further, as described above, the one end portions of the connection portions 31 to 37 engage with the comb-toothed portion 600 of the insulating portion 6, thereby allowing the insulating portion 6 to be present between adjacent pairs of the connection portions 31 to 37. That is, the insulating portion 6 is present between adjacent pairs of the end surfaces 311 to 317 of the connection portions 31 to 37 and also between the end surfaces 311 to 317 of the connection portions 31 to 37 and the first bus bar 3a. The connection portions 31 to 37 are made of pure copper or a copper alloy, for example.

The insulating portion 6 is arranged inward of the connection portions 31 to 37 by using, for example, dowels (not shown) or positioning portions (not shown) provided on inner side surfaces of the frame body 11. The end surfaces 311 to 317 on the one end side of the connection portions 31 to 37 are flush with an upper surface 68 (conductive surface) of the insulating portion 6 provided with conductive portions 8 to be described below (see FIG. 5).

A predetermined gap 38 (second gap) is formed between each of the connection portions 31 to 37 and the comb-toothed portion 600 of the insulating portion 6. Specifically, the connection portions 31 to 37 are respectively spaced apart from the edges of the empty portions 601 to 607 of the comb-toothed portion 600 in the direction transverse to the arrangement direction of the connection portions 31 to 37, i.e., in the front-rear direction, with the second gaps 38 interposed between the connection portions 31 to 37 and the edges of the empty portions 601 to 607.

The connection portions 31 to 37 and the first bus bar 3a are integrally formed. For example, a plate made of pure copper or a copper alloy is plated with nickel, and the plate is then subjected to processing such as chopping, cutting, and pressing to integrally form the connection portions 31 to 37 and the first bus bar 3a. With this configuration, in the circuit structure 10 according to the present embodiment, the first conductor 3 does not include a so-called connection point, and this enables a reduction in electric resistance.

The circuit structure 10 according to the present embodiment is not limited thereto, and the first conductor 3 may include the connection portions 31 to 37 and the first bus bar 3a that are formed separately.

Linear conductive portions 8 are provided on the upper surface 68 of the insulating portion 6. The conductive portions 8 are copper foils, for example. A plurality of pin-shaped connection terminals 4 to be connected to the control circuit board 9 are provided in a left end portion on the upper surface 68 of the insulating portion 6. The conductive portions 8 connect the gate terminals of the semiconductor elements 7 to the connection terminals 4, respectively.

More specifically, the semiconductor elements 71 to 77 are connected to the connection terminals 4 by conductive portions 81 to 87, respectively. For example, the insulating portion 6 may be an insulating substrate, and the conductive portions 81 to 87 may be provided as a pattern printed on the upper surface 68 of the insulating portion 6.

The present embodiment is not limited thereto. For example, the conductive portions 81 to 87 may be provided by forming grooves that do not interfere with each other on the upper surface 68 of the insulating portion 6 and then providing a conductive material inside each of the thus-formed grooves.

Specifically, each groove may be provided as a recess extending from a position to be aligned with the gate terminal of a corresponding one of the semiconductor elements 71 to 77 fixed to the second conductor 2 to a corresponding one of the connection terminals 4, and a conductive material, e.g., copper nanoparticle ink, may be applied to the inside of each groove.

In the above-described manner, the connection terminals 4 are connected to the gate terminals of the semiconductor elements 71 to 77 via the conductive portions 81 to 87, respectively.

The connection terminals 4 are connected to the control circuit board 9, and transmit control signals that the control circuit board 9 transmits for controlling the semiconductor elements 71 to 77 to the gate terminals of the respective semiconductor elements 71 to 77 via the conductive portions 81 to 87. As a result, the semiconductor elements 71 to 77 are controlled, whereby supply of electric power from the first conductor 3 to the second conductor 2 or from the second conductor 2 to the first conductor 3 is controlled.

As described above, the connection portions 31 to 37 (semiconductor elements 71 to 77) are arranged side by side in a rear peripheral edge portion (comb-toothed portion 600) of the insulating portion 6, and are provided in the region of the peripheral edge portion excluding both ends thereof in the left-right direction.

On the other hand, in the insulating portion 6, gap maintaining portions 69 for maintaining the gap 50 between the first bus bar 3a and the second bus bar 2a are provided in both end portions of the rear peripheral edge portion in the left-right direction. In both end portions of the peripheral edge portion of the insulating portion 6 in the left-right direction, the gap maintaining portions 69 protrude toward the second bus bar 2a side, in other words, in a direction in which the second conductor 2 is spaced apart from the first conductor 3, by an amount corresponding to the gap 50. The present disclosure is not limited thereto, and the gap maintaining portions 69 may be partially present in the gap 50.

As described above, in the circuit structure 10 according to the present embodiment, the gap maintaining portions 69 are provided in both end portions of the peripheral edge portion of the insulating portion 6 in the left-right direction and thus they are spaced apart from the semiconductor elements 71 to 77. Accordingly, problems caused by thermal expansion of the gap maintaining portions 69 due to heat generated by the semiconductor elements 71 to 77 can be prevented in advance.

The semiconductor elements 71 to 77 are fixed to the second conductor 2 (second bus bar 2a). The second bus bar 2a has a rectangular plate-like shape, and the semiconductor elements 71 to 77 are arranged side by side in a front peripheral edge portion of the upper surface thereof. The semiconductor elements 71 to 77 include the drain terminals on the undersides thereof. Accordingly, the semiconductor elements 71 to 77 are fixed to the second bus bar 2a by, for example, soldering the drain terminals to the second bus bar 2a.

For example, in the semiconductor element 71, the drain terminal 731 is soldered to the front peripheral edge portion of the second bus bar 2a. As a result, the semiconductor element 71 is connected to the second bus bar 2a and is also fixed to the second bus bar 2a.

A circuit pattern is formed on the control circuit board 9, and a controlling element such as a microcomputer or a control IC is mounted thereon. The control circuit board 9 is connected to the connection terminals 4 and the connector terminals 5. In response to instruction signals input to the control circuit board 9 via the connector terminals 5, the control circuit board 9 transmits control signals for controlling ON and OFF of the semiconductor elements 71 to 77 to the semiconductor elements 71 to 77 via the connection terminals 4 and the conductive portions 81 to 87.

According to the circuit structure 10 of the present embodiment with the above-described configuration, even when the plurality of semiconductor elements 7, each including the plurality of terminals arranged at a narrow pitch, are arranged side by side in the circuit structure 10, wiring for the respective terminals of the semiconductor elements 7 can be performed with high accuracy.

Specifically, in the circuit structure 10 according to the present embodiment, wiring for the source terminals of the semiconductor elements 7 is performed using the connection portions 31 to 37 and wiring for the gate terminals of the semiconductor elements 7 is performed using the conductive portions 81 to 87 of the insulating portion 6. This allows accurate wiring and also can prevent the occurrence of short-circuiting between the wiring for the source terminals and the wiring for the gate terminals.

Further, the conductive portions 8 are provided in the insulating portion 6, and many wiring lines can be collectively provided by patterning the conductive portions 8.

In the circuit structure 10 according to the present embodiment, each of the connection portions 31 to 37 is bent to form a C-shape with the space 61 formed on the inner sider thereof as described above. Accordingly, the above-described one end portions of the connection portions 31 to 37 can deform in the up-down direction.

Moreover, the connection portions 31 to 37 are arranged such that the second gaps 38 are formed between the connection portions 31 to 37 and the edges of the empty portions 601 to 607 of the comb-toothed portion 600 in the left-right direction and that the gap 50 is formed between the connection portions 31 to 37 and the second bus bar 2a of the second conductor 2. Accordingly, the above-described one end portions of the connection portions 31 to 37 can deform in the front-rear direction.

For the reasons described above, when the semiconductor elements 71 to 77 generate heat, the one end portions of the connection portions 31 to 37 can deform in response to heat being generated, and thus stress can be reduced. Further, thermal expansion of the second bus bar 2a due to heat generated by the semiconductor elements 71 to 77 can be dealt with.

A production method of the circuit structure 10 according to the present embodiment will be described below. FIGS. 7 to 12 are diagrams for illustrating a production method of the circuit structure 10 according to the present embodiment.

First, a surface of a plate made of pure copper or a copper alloy and having a thickness of 2 to 3 mm is plated with nickel. The thus-obtained nickel-plated plate is then cut into predetermined shapes, and these cut pieces are formed into a first conductor 3 and a second conductor 2. In particular, in order to form the first conductor 3, a cut piece is first formed into a comb shape, and thereafter, portions to be processed into connection portions 31 to 37 are bent. At this time, bending is performed in such a manner that end surfaces 311 to 317 of the connection portions 31 to 37 are flush with each other.

The first conductor 3, the second conductor 2, and connector terminals 5 are placed in a mold for insert molding, and they are integrally molded using an injection molding machine. A highly heat-resistant thermoplastic resin such as polyphenylene sulfide (PPS) is used as the molding resin. As a result, a hollow rectangular frame body 11 is formed, and an upper surface of the second conductor 2 and the end surfaces 311 to 317 of the connection portions 31 to 37 are arranged such that they are flush with each other.

The insulating portion 6 on which conductive portions 8 (for example, a wiring pattern) are printed is mounted onto the first conductor 3 and on the inner side of the connection portions 31 to 37.

A peripheral edge portion of the second conductor 2 is provided with a solder mounting pad, and the peripheral edge portion is arranged in the vicinity of the end surfaces 311 to 317 of the connection portions 31 to 37 so as to be parallel with the connection portions 31 to 37. Connection terminals 4 are soldered to the insulating portion 6 beforehand.

When mounting the semiconductor elements 71 to 77, solder paste 40 is applied to the second conductor 2 to which drain terminals are to be soldered, to the end surfaces 311 to 317 of the connection portions 31 to 37 to which source terminals are to be soldered, and to a mounting pad of the insulating portion 6. Thereafter, the semiconductor elements 71 to 77 are set in position, and soldering is performed in a reflow furnace.

As a result, the drain terminals of the semiconductor elements 71 to 77 are joined to the second conductor 2, and the source terminals of the semiconductor elements 71 to 77 are joined to the end surfaces 311 to 317 of the connection portions 31 to 37 of the first conductor 3. Also, the gate terminals of the semiconductor elements 71 to 77 are joined to the conductive portions 8 of the insulating portion 6.

Next, the connection terminals 4 and the connector terminals 5 are soldered to through-hole portions (see FIG. 3) formed at predetermined positions in the control circuit board 9.

The embodiments disclosed herein should be construed in all aspects as illustrative and not restrictive. The scope of the present disclosure should be defined by the appended claims rather than by the description preceding them, and all modifications equivalent to or within the spirit and scope of the appended claims are therefore intended to be encompassed by the present disclosure.

The invention claimed is:

1. A circuit structure including a plurality of semiconductor elements that are arranged side by side, each semiconductor element including a plurality of first terminals and at least one second terminal that is arranged side by side with the first terminals, the circuit structure comprising:
   a first conductive piece connected to the first terminals of the semiconductor elements;
   a plurality of connection portions that connect the first terminals and the first conductive piece, the connection portions being arranged side by side along an arrangement direction of the semiconductor elements and one end of each connection portion being connected to the first terminals of a corresponding one of the semiconductor elements;
   an insulating portion that is provided so as to be present between each adjacent pair of connection portions; and
   conductive portions that are provided in the insulating portion and are connected to the second terminals.

2. The circuit structure according to claim 1, wherein each connection portion has a bent rectangular plate-like shape, and
   the insulating portion includes a comb-toothed portion that engages with the one ends of the respective connection portions.

3. The circuit structure according to claim 2, wherein the first conductive piece and the plurality of connection portions are integrally formed.

4. The circuit structure according to claim 2, wherein an end surface of each connection portion on the side of the one ends connected to the first terminals is flush with a conductive surface of the insulating portion on which the conductive portions are formed.

5. The circuit structure according to claim 4, wherein the circuit structure includes a second conductive piece that is provided flush with the conductive surface of the insulating portion and is spaced apart from the connection portions in a direction transverse to an arrangement direction of the connection portions with a first gap interposed between the second conductive piece and the connection portions, and
   a third terminal of each semiconductor element is connected to the second conductive piece.

6. The circuit structure according to claim 5, wherein the insulating portion is rectangular,
   the comb-toothed portion is formed in a region excluding both ends of one edge portion of the insulating portion, and
   gap maintaining portions that maintain the first gap between the first conductive piece and the second conductive piece are provided on both end sides of the one edge portion.

7. The circuit structure according to claim 2, wherein, in a direction transverse to an arrangement direction of the connection portions, a second gap is formed between each connection portion and the comb-toothed portion of the insulating portion.

8. An electrical junction box comprising:
   the circuit structure according to claim 1; and
   a control circuit board for controlling the semiconductor elements of the circuit structure.

9. The circuit structure according to claim 3, wherein an end surface of each connection portion on the side of the one ends connected to the first terminals is flush with a conductive surface of the insulating portion on which the conductive portions are formed.

10. The electrical junction box according to claim 8, wherein each connection portion has a bent rectangular plate-like shape, and
    the insulating portion includes a comb-toothed portion that engages with the one ends of the respective connection portions.

11. The electrical junction box according to claim 10, wherein the first conductive piece and the plurality of connection portions are integrally formed.

12. The electrical junction box according to claim 10, wherein an end surface of each connection portion on the side of the one ends connected to the first terminals is flush with a conductive surface of the insulating portion on which the conductive portions are formed.

13. The electrical junction box according to claim 12, wherein the circuit structure includes a second conductive piece that is provided flush with the conductive surface of the insulating portion and is spaced apart from the connection portions in a direction transverse to an arrangement direction of the connection portions with a first gap interposed between the second conductive piece and the connection portions, and
    a third terminal of each semiconductor element is connected to the second conductive piece.

14. The electrical junction box according to claim 13, wherein the insulating portion is rectangular,
    the comb-toothed portion is formed in a region excluding both ends of one edge portion of the insulating portion, and
    gap maintaining portions that maintain the first gap between the first conductive piece and the second conductive piece are provided on both end sides of the one edge portion.

15. The electrical junction box according to claim 10, wherein, in a direction transverse to an arrangement direction of the connection portions, a second gap is formed between each connection portion and the comb-toothed portion of the insulating portion.

* * * * *